United States Patent [19]

Yamaguchi et al.

[11] Patent Number: 5,324,550
[45] Date of Patent: Jun. 28, 1994

[54] PATTERN FORMING METHOD

[75] Inventors: Hidenori Yamaguchi, Kokubunji; Fumio Murai; Norio Hasegawa, both of Tokyo; Toshio Sakamizu, Kokubunji; Hiroshi Shiraishi, Hachioji, all of Japan

[73] Assignee: Hitachi, Ltd., Tokyo, Japan

[21] Appl. No.: 929,196

[22] Filed: Aug. 12, 1992

[51] Int. Cl.$^5$ .............. B05D 3/06; G03C 5/00; G03C 5/18; G03C 5/26

[52] U.S. Cl. .............. 427/510; 427/503; 427/504; 427/515; 427/517; 430/294; 430/408; 430/433

[58] Field of Search .............. 427/510, 512, 515, 517, 427/498, 503, 504; 156/628, 633; 430/294, 408, 329, 433

[56] References Cited

U.S. PATENT DOCUMENTS

| | | | |
|---|---|---|---|
| 4,154,872 | 5/1979 | Tsao et al. | 427/517 |
| 4,156,035 | 5/1979 | Tsao et al. | 427/517 |
| 4,571,349 | 2/1986 | Hockemeyer et al. | 427/517 |
| 4,708,926 | 11/1987 | Kirchmayr et al. | 427/510 |
| 5,139,815 | 8/1992 | Patterson | 427/515 |

OTHER PUBLICATIONS

J. Vac. Sci. Technol. B6(1), Jan./Feb. 1988, C. P. Umbach et al.: *Nanolithography with an acid catalyzed resist*, pp. 319-322.

J. Vac. Sci. Technol. B6(1), Jan./Feb. 1988, Mark P. deGrandpre et al.: *Characterization of a high-resolution novolak based negative electron-beam resist with 4 $\mu C/cm^2$ sensitivity*, pp. 379-383.

*Primary Examiner*—Marianne Padgett
*Attorney, Agent, or Firm*—Kenyon & Kenyon

[57] ABSTRACT

In forming a resist pattern by forming a resist film containing an acid generator on a spin on glass film or a silicon resin film and subsequent exposure of light, an inhomogeneous distribution of an acid in the resist film caused by the spin on glass film or the silicon resin film is remedied by adding an acid generator beforehand into the spin on glass film or the silicon resin film or by using an organic polymer containing an acid generator. As a result, a profile defect in a cross section of the resist pattern caused by inhomogeneous acid distribution is prevented and the resist pattern has a rectangular cross-sectional shape.

13 Claims, 4 Drawing Sheets

PATTERN FORMING METHOD

BACKGROUND OF THE INVENTION

The present invention relates to a pattern forming method, and more particularly to a pattern forming method capable of easily forming a resist pattern having a good cross-sectional shape.

Attempts to realize a higher integration level of (Ultra Large Scale Integrated Circuits (ULSI) have been made quickly corresponding to four times the initial integration density within a period of three years. Mass production of a 4 Mbit DRAM and a trial manufacture of a 16 Mbit DRAM have already been conducted. The minimum size required in the production of a ULSI has changed from 0.8 $\mu$m to 0.5 $\mu$m, a further to 0.5 $\mu$m or less, and thus the ULSI structure is becoming more and more minute. For matching such trend to a smaller structure, studies are being made to improve the resolution in various lithography techniques.

In photolithography, which is presently a major lithography technique, a pattern forming method which utilizes a shorter wavelength of light than the light used heretofore is now under study for the improvement of resolution. However, the shorter the wavelength of light, the larger the amount of light absorbed in a resist film, and hence a pattern shape is more apt to be deteriorated. To solve this problem, it has been considered necessary to use a resist material of a high light transmittance. In electron beam lithography which will be a main lithography technique in the next generation, a resist material of high sensitivity is desired for the improvement o productivity.

Recently, new resist materials of high performance which utilize a chemical amplification reaction, or a catalytic reaction, have been attracting attention of many concerns, as shown, for example, in J. Vac. Sci. Technol B6(1), Jan/Feb '88, pp. 319-322, "Nanolithography with an acid catalyzed resist" and ibid., pp. 379-383, "Characterization of a high-resolution novolak based negative electron-beam resist with 4 $\mu$C/cm$^2$ sensitivity."

In resist material utilizing a chemical amplification reaction a material is included which produces a catalytic substance upon exposure of an energy ray thereto. This resist material is characteristic in that the intermediate substance created by the exposure of an energy ray serves as a catalyst in the reaction of resist during a subsequent treatment such as heat treatment, thereby permitting the reaction to proceed efficiently. Therefore, the transmissivity and sensitivity can be enhanced as compared with conventional resist materials.

However, it turned out in an experiment conducted by the present inventors that when the above chemically amplified resist was applied onto a film of spin on glass (the spin on glass generally indicates a compound having such a siloxane structure as illustrated in FIG. 8 wherein $Z_1$ and $Z_2$ are each independently an alkyl, alkoxyl, acetoxyl or hydroxyl group or hydrogen or a siloxane compound and n represents a mean condensation number of the spin on glass), followed by exposure and development in a conventional manner, an abnormal condition occurred in the cross-sectional shape of the resist pattern. This profile abnormality in the section of the resist film is presumed to be a phenomenon which occurs due to a decrease in the amount of the catalytic substance in the resist material in a position near the base film and the resulting inhomogeneous distribution of the catalytic substance in the thickness direction of the resist film. Particularly, in a negative type resist wherein an energy ray-exposed portion remains after development, an abnormal undercut is formed in the bottom of the pattern, resulting in falling or delamination of the resist pattern. This is a serious problem which must be solved. A more detailed explanation of this phenomenon will be made below with reference to FIG. 2a and 2b.

In the case of forming a resist pattern by a three-layer resist method using an antireflective film 204 of an organic compound as a bottom layer, a spin on glass film 203 as a middle layer and a chemical amplified resist film 202 of, for example, a negative type as a top layer, a catalytic substance 205 is formed in a portion exposed with energy ray 201 and a latent image of pattern is formed. However, a drop-out portion 206 of the catalytic substance 205 is formed in the resist film 202 because the amount of the catalytic substance in the resist film 202 is decreased by the spin on glass film 203, resulting in that the distribution of the catalytic substance 205 in the interior of the resist film 202 becomes inhomogeneous as shown in FIG. 2a. Since the catalytic substance 205 acts to induce a crosslinking reaction, the same reaction does not occur in the catalytic substance dropped-out portion so that the cross-sectional shape of the resist pattern 202 formed by development becomes abnormal as shown in FIG. 2b. Consequently, the kind of base materials capable of processing into a predetermined shape using a chemical amplified resist is markedly restricted and it becomes difficult to use this resist in the manufacture of a ULSI circuit.

SUMMARY OF THE INVENTION

The present invention relates to a pattern forming method capable of forming a desired pattern using the foregoing resist material independently of the kind of base material while preventing the occurrence of an abnormal condition in the section of the pattern.

This is attained by incorporating a generator of the catalyst into a spin on glass film on which the resist film is to be formed, or by disposing below the spin on glass film a film which contains the catalyst generator, in the case of applying a resist material utilizing a chemical amplification (catalyst) reaction to photolithography. In many cases, an acid is used as the catalyst, and an acid generator is used as the catalyst generator. The following description is now provided about the case where such an acid catalyst material is used.

As shown in FIG. 1a, an organic compound film 4 containing an acid generator, a spin on glass film 3 and a chemical amplified resist film 2 are laminated in this order onto a substrate 7. Upon radiation of energy ray 1 to a predetermined area, an acid 5 is generated in the resist film 2. Since the energy ray 1 passes through the spin on glass film 3 and reaches the organic compound film 4, an acid 6 is also generated in the film 4. Distribution of the acid 5 becomes inhomogeneous in the resist film 2 and a dropped-out portion of the acid is formed. However, the acid 6 generated in the organic compound film 4 passes through the spin on glass film 3 and is diffused into the resist film 2 and the drop-out of the acid 5 in the resist film 2 is compensated for by the acid 6 thus diffused, so that acid concentration distribution becomes homogeneous. As a result, a resist pattern 2 is formed having a good cross-sectional shape, as shown in FIG. 1b.

A resist pattern having a normal cross-sectional shape may be obtained by disposing a layer of an organic compound containing an acid generator below the spin on glass film as described above.

Acceptable materials which may be used as the acid generator include, for example, onium salt, sulfonic acid ester, or a halogen compound having a triazine ring.

DETAILED DESCRIPTION

Embodiment 1

According to the first embodiment of the present invention, a novolak resin film formed using a solution incorporating 5% of a photo acid generator therein and having a benzene ring and having a photo absorption coefficient of about 1 $\mu m^{-1}$ is used as a bottom layer (an antireflective layer) of a three-layer resist.

Figure 1A:
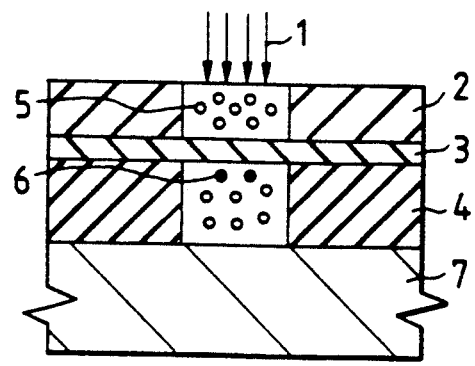
FIGS. 1a and 1b are diagrams for explaining the principle of the present invention.
Figure 1B:
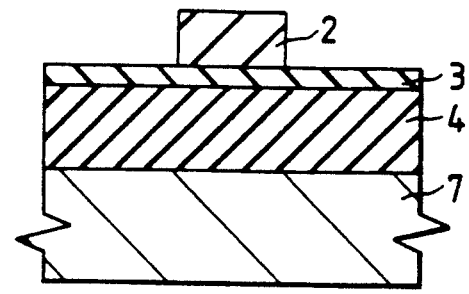
Figure 2A:
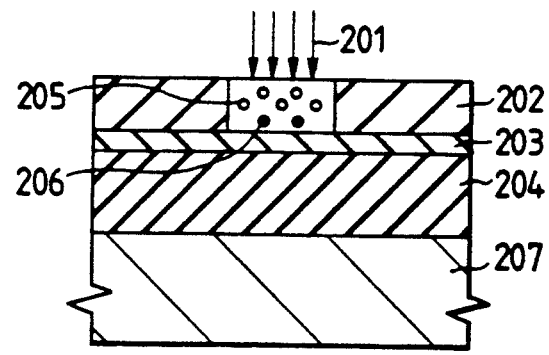
FIGS. 2a and 2b are diagrams for explaining a defective phenomenon in cross-sectional shape of a resist pattern.
Figure 2B:
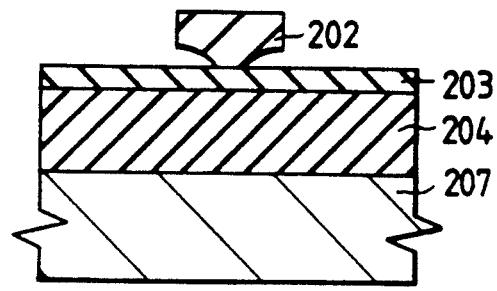
Figure 3A:
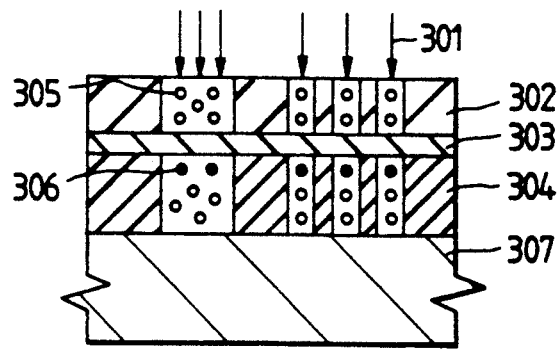
FIGS. 3a and 3b are diagrams showing a first embodiment of the present invention.
Figure 3B:
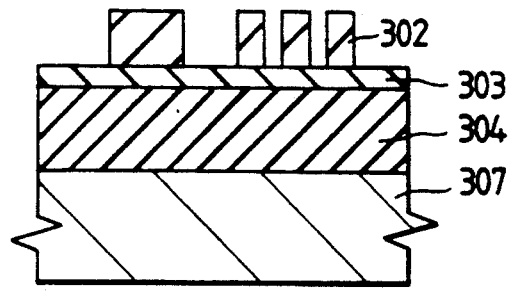

As shown in FIG. 3a, the above novolak resin film having a thickness of 1.6 $\mu m$ and indicated at 304 was formed on an article 307 to be etched by a conventional coating method, followed by baking at 230° C. for 6 minutes using a hotplate baking type system to render the novolak resin film 304 insoluble. Then, a spin on glass film 303 was formed on the novolak resin film 304, followed by baking at 230° C. for 6 minutes to harden the spin on glass film 303. After an adhesion-promoting treatment, a chemical amplified negative photoresist consisted of a base polymer (such as a novol resin), a cross-linker (such as a melamine resin) and a photo acid generator such as THMR-iN200 (a product of Tokyo Ohka) or equivalent to form a photoresist film 302, followed by baking at 90° C. for 2 minutes using the above baking system to remove the solvent and patterns were exposed by using i-line light 301 of a mercury lamp using a reduction projection aligner (NA=0.42). Next, heat-treatment was performed at 110° C. for 2 minutes, followed by development using a tetramethylammonium hydroxide solution having a concentration of 2.38%, to form a photoresist pattern 302 as shown in FIG. 3b.

As a result of having observed a cross section of the photoresist pattern 302 by means of a scanning electron microscope, the cross section of the pattern was found to be a good rectangular section having no abnormal portion. This is presumed to be because an acid 306 generated in the organic resin film 304 by the radiation of light has entered the photoresist film 302 through the spin on glass film 303 and cancelled or mitigated inhomogeneous distribution of an acid 305 present in the irradiated area of the photoresist film 302. As to the novolak resin film, one having a photo absorption coefficient in the range of 0.02 to 2 $\mu m^{-1}$ is employable as an antireflective film. But when the dimensional accuracy and stability of pattern are considered, it is more preferable that the photo absorption coefficient range be 0.08 to 1.2 $\mu m^{-1}$.

Although a resin containing 5% of the photo acid generator, for the solid resin composition, is used to form a bottom layer, a resin containing 1.25–10% of photo acid generator can be used, in the present invention.

Embodiment 2

Figure 4A:
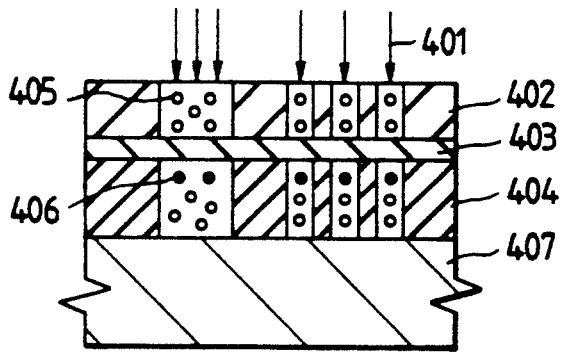
FIGS. 4a and 4b are diagrams showing a second embodiment of the present invention.
Figure 4B:
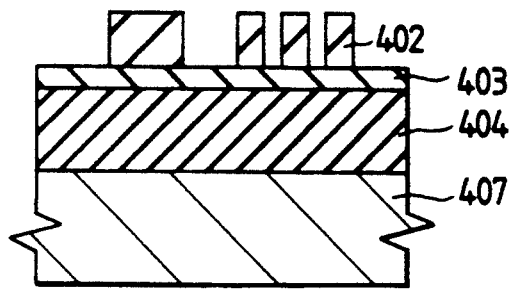

In this embodiment, as shown in FIG. 4a, a film 402 of a chemical amplified resist SAL601 (a product of Shipley Far East Co.), a spin on glass film 403 and a resist THMR-iN200 film 404 were used as top, middle and bottom layers, respectively. After the formation of each of the bottom film 404 and the spin on glass film 403, baking was performed at 230° C. for 6 minutes. Then, the surface of the spin on glass film 403 was subjected to an adhesion-promoting treatment and thereafter the resist 402 was applied, followed by soft baking at 80° C. for 30 minutes. Subsequently, electron beam 401 was radiated to a desired area by means of an electron beam direct writing machine of an acceleration voltage of 30 kV. After heat treatment, development was made using a tetramethylammonium hydroxide (0.27 N) solution to form a resist pattern 402 as shown in FIG. 3b.

Also in this embodiment, like embodiment 1, a resist pattern may be obtained having a good rectangular cross section and having no abnormal portion.

Embodiment 3

In this embodiment, a film of a chemical amplified negative photoresist THMR-iN200 (a product of Tokyo Ohka) was used as a top layer in a multi-layer resist method and it was also formed under a spin on glass film, whereby there was formed a pattern of a four-layer structure.

Figure 5A:
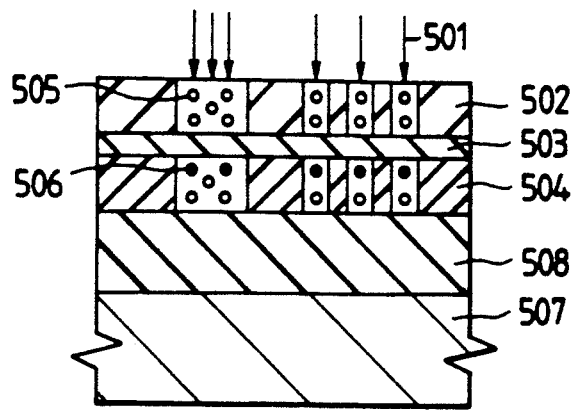
FIGS. 5a and 5b are diagrams showing a third embodiment of the present invention.
Figure 5B:
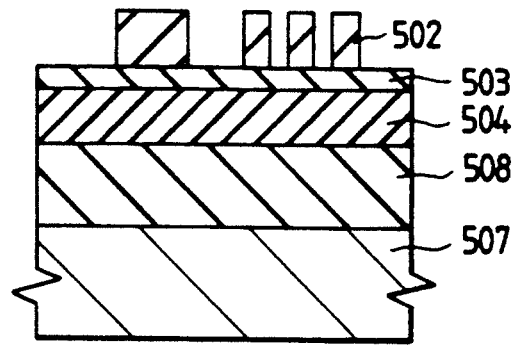

As shown in FIG. 5a, a 1.6 $\mu m$ thick antireflective film 508 was formed on an article 507 to be etched, using an organic photo absorption material (trade name: RAYCAST (RB3900B), a product of Hitachi Chemical Co. Ltd.), by a conventional coating method, followed by baking at 230° C. for 6 minutes using a hotplate baking type system to render the film 508 insoluble. Then, a resist film 504 was formed by the application of the above resist THMR-iN200, followed by baking in the same manner as above to render the film 504 insoluble. Then, spin on glass was applied onto the resist film 504 to form a spin on glass film 503, followed by baking at 230° C. for 6 minutes to harden the film 503. The surface of the spin on glass film 503 was subjected to an adhesion-promoting treatment and thereafter a second resist film 502 was formed by the application of THMR-iN200, followed by baking at 90° C. for 2 minutes using the above baking system to remove the solvent. Patterns were exposed with the i-line light 501 by means of a reduction projection aligner (NA=0.42). After baking at 110° C. for 2 minutes, development was made using a tetramethylammonium hydroxide solution having a concentration of 2.38% to form a resist pattern 502 as shown in FIG. 5b. As a result of having observed a cross section of the resist pattern 502 using a scanning electron microscope, it turned out that there was obtained a good rectangular cross-sectional shape even in a fine pattern portion without any abnormal part.

Embodiment 4

In this embodiment, a resist pattern was formed using a silicon resin incorporating therein an acid generator, triphenylsulfonium trifluoromethane sulfonate, as a middle layer in a three-layer resist method.

Figure 6A:
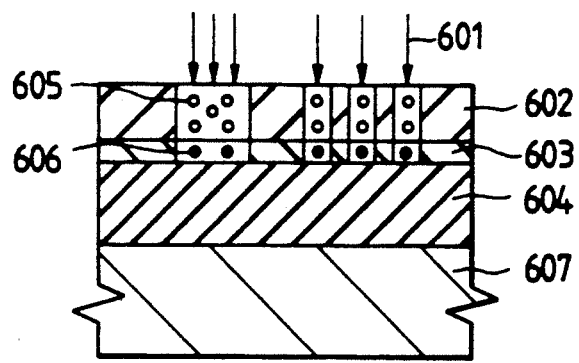
FIGS. 6a and 6b are diagrams showing a fourth embodiment of the present invention.

As shown in FIG. 6a, the said acid generator was added in an amount of 5% based on glass solids content to a silicon resin solution containing methanol as a main component and then the silicon resin was applied onto a silicon substrate 607 at a thickness of 0.1 μm to form a silicon resin film 603. The numeral 604 represents an antireflective film formed using an organic material. Then, the solvent was removed from the silicon resin 603 by baking at 200° C. for 30 minutes. The surface of the silicon resin film 603 was subjected to an adhesion-promoting treatment and thereafter a chemical amplified resist material SAL601 (a product of Shipley Far East Co.), indicated at 602, was applied at a thickness of 0.5 μm to form a resist film 602, then a pattern was written with electron beam 601, using an electron beam direct writing machine of an acceleration voltage of 30 kV.

Figure 6B:
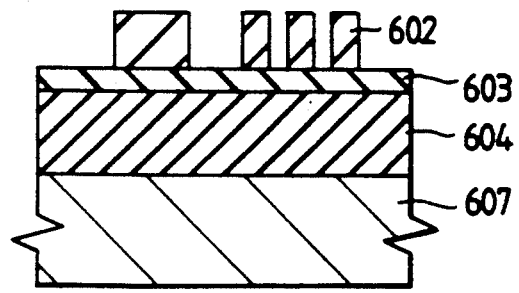

Next, after post exposure baking at 110° C. for 10 minutes, development was made using a tetramethylammonium hydroxide (0.27 N) solution to form a resist pattern 602 as shown in FIG. 6b. As a result of having observed a cross section of the resist pattern 602 using a scanning electron microscope, it turned out that there was obtained a good rectangular cross-sectional shape without an abnormal portion. This result may be obtained by the fact that an acid 606 generated in the silicon resin film 603 has entered the resist film 602 and cancelled inhomogeneous distribution of an acid 605 generated in the irradiated area of the resist film 602.

Although, in this embodiment, the resin containing 5% of the photo acid generator, for silicon resin solid composition, is used to form a middle layer, the resin containing 1.5–10% of the photo acid generator can be used in the present invention.

Embodiment 5

In this embodiment, a film formed of a material comprising titanium oxide-containing spin on glass and triphenylsulfonium trifluoromethane sulfonate as an acid generator incorporated in the spin on glass in an amount of 5% based on glass solids content, was used as a bottom layer of a chemical amplified positive resist film. As same as embodiments 1 and 4, the resin containing 1.25–10% of photo acid generator can be used in this embodiment.

Figure 7A:
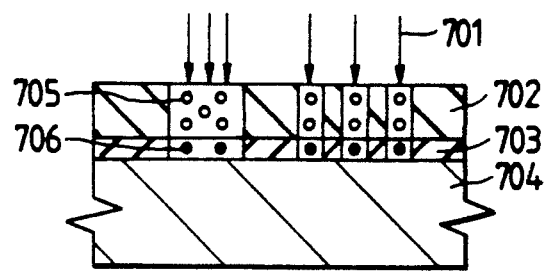
FIGS. 7a and 7b are diagrams showing a fifth embodiment of the present invention.
Figure 7B:
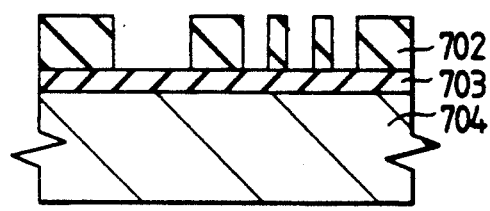
Figure 8:
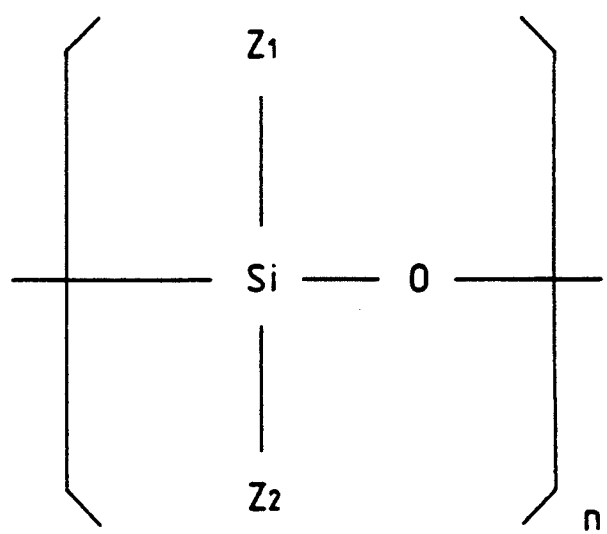
FIG. 8 is a diagram showing a general structure of spin on glass.

The spin on glass material containing the above acid generator was applied onto an article 704 to be etched to form a spin on glass film 703, on which was then formed a positive resist film 702, followed by exposure of electron beam 701 to form a pattern. As a result, there was formed a resist pattern 702 having a good cross-sectional shape, as shown in FIG. 7b.

The above result may be obtained in this embodiment by the fact that an acid 706 generated by the radiation of electron beam has been diffused into the resist film 702 and cancelled or mitigated inhomogeneous distribution of an acid 705 generated in the irradiated area of the resist film 702. According to this embodiment, therefore, at the time of patterning a chemical amplified positive resist comprising a novolak resin, a dissolution inhibitor and an acid generator, on a film of a composite spin on glass of titanium oxide and silicon oxide, it is possible to prevent the resist bottom from becoming insoluble and thereby obtain a resist pattern having a good cross-sectional shape.

Since the present invention relates to a method of avoiding a profile abnormality by the use of a material containing an acid generator, it is readily apparent to one of ordinary skill in the art that not only spin coatable silicon resins or spin on glass but also other materials are employable if they incorporate an acid generator therein.

According to the present invention, as will be apparent from the above description, it is possible to prevent the occurrence of a profile abnormality in cross section of a chemical amplified resist pattern caused by a certain base material, without adding any complicated process to the conventional multi-layer resist process. In this case, the kind and content of an acid in the chemical amplified resist can be selected suitably while taking into account the combination thereof with an acid generator contained in the film.. formed under the resist film. Although the above description relates to a method for preventing the occurrence of an abnormal condition in a cross section of pattern caused by the loss of acid in the chemical amplified resist, even in the event of an abnormal phenomenon caused by volatilization or diffusion of a substance contained in the resist film, the same effect as above can be obtained by making up for the loss of the substance using the material of the underlying layer. It is also possible to practice the present invention using other kinds of photoregister. Consequently, the superior performance of a chemical amplified resist or the like utilizing the reaction of a catalyst substance can be utilized effectively in the manufacture of semiconductor devices and ultra-fine devices, including ULSI which will become more and more high in integration level in the future. Thus, the present invention is extremely effective in promoting the improvement in integration density of various semiconductor devices more strongly.

What is claimed is:

1. A pattern forming method comprising steps of:
   forming a first film on a surface of a substrate;
   forming a photoresist film on said film, said first film and said photoresist film containing an acid generator from which acid is generated by light irradiation, whereby solubility of a light radiated portion of said photoresist film is changed by a reaction using the acid as a catalyst;
   irradiating a light onto said photoresist film and said first film to generate the acid in said light radiated portion of said photoresist film and said first film, wherein the acid which is generated in said light radiated portion of said first film is diffused into said light radiated portion of said photoresist film, where a drop-out portion of the acid in said light radiated portion of said photoresist film is compensated for by said diffused acid and acid concentration distribution in said radiated portion of said photoresist film becomes homogeneous; and
   developing said photoresist film to form a pattern of said photoresist film.

2. A pattern forming method according to claim 1, wherein an antireflection film is interposed between said first film and said substrate.

3. A pattern forming method according to claim 1, wherein a film of glass having a siloxane structure is interposed between said first film and said photoresist film.

4. A pattern forming method according to claim 1, wherein a silicon resin film is interposed between said first film and said photoresist film.

5. A pattern forming method according to claim 1, wherein said first film is an organic polymer film containing the acid generator.

6. A pattern forming method according to claim 1, wherein said first film is a film selected from a group consisting of glass having a siloxane structure, and a silicon resin.

7. A pattern forming method according to claim 1, wherein said acid generator is selected from a group consisting of onium salt, sulfonic acid esters and a triazine ring-containing halogen compound.

8. A pattern forming method according to claim 1, wherein a concentration of said acid generator contained in said photoresist film is substantially equal to the concentration of said acid generator contained in said first film.

9. A pattern forming method according to claim 1, wherein said first film contains 1.25% to 10% of said acid generator.

10. A pattern forming method according to claim 1, wherein said photoresist film is a negative type photoresist film.

11. A pattern forming method according to claim 1, wherein said photoresist film is a positive type photoresist film.

12. A pattern forming method according to claim 1, wherein the acid caused in said first film by exposure to light is diffused into said photoresist film, whereby a non-uniform distribution of the acid in said photoresist film is remedied.

13. A pattern forming method according to claim 1, wherein said first film is a resist.

* * * * *

UNITED STATES PATENT AND TRADEMARK OFFICE
CERTIFICATE OF CORRECTION

PATENT NO. : 5,324,550
DATED : Jun. 28, 1994
INVENTOR(S) : Hidenori Yamaguchi, et al It is certified that error appears in the above-indentified patent and that said Letters Patent is hereby corrected as shown below:

Column 1, line 10, change "(Ultra" to --Ultra--.
Column 1, line 33, change "o" to --of--
Column 6, line 32, change "photoregister." to --photoresists.--.
Column 6, line 45, change "on said film," to --on said first films,--

Signed and Sealed this

Eighth Day of November, 1994

Attest:

BRUCE LEHMAN

Attesting Officer    Commissioner of Patents and Trademarks